(12) United States Patent
Castagnetti et al.

(10) Patent No.: US 6,934,174 B2
(45) Date of Patent: Aug. 23, 2005

(54) RECONFIGURABLE MEMORY ARRAYS

(75) Inventors: Ruggero Castagnetti, Menlo Park, CA (US); Ramnath Venkatraman, San Jose, CA (US); Subramanian Ramesh, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 182 days.

(21) Appl. No.: 10/655,053

(22) Filed: Sep. 3, 2003

(65) Prior Publication Data
US 2005/0047238 A1 Mar. 3, 2005

(51) Int. Cl.[7] .................................................. G11C 5/02
(52) U.S. Cl. ........................................... 365/51; 365/63
(58) Field of Search ............................ 365/210, 51, 63

(56) References Cited

U.S. PATENT DOCUMENTS

| | | | |
|---|---|---|---|
| 5,877,976 A | | 3/1999 | Lattimore et al. |
| 5,923,593 A | | 7/1999 | Hsu et al. |
| 6,236,618 B1 | * | 5/2001 | Roy |
| 6,266,263 B1 | | 7/2001 | Lien et al. |
| 6,380,592 B2 | | 4/2002 | Tooher et al. |
| 6,552,951 B1 | | 4/2003 | Raj et al. |
| 6,594,196 B2 | * | 7/2003 | Hsu et al. |

* cited by examiner

Primary Examiner—Son T. Dinh
Assistant Examiner—Hien Nguyen
(74) Attorney, Agent, or Firm—Sawyer Law Group

(57) ABSTRACT

A method and system for reconfiguring a memory array is disclosed. Initially, the cells in the memory array are patterned with substantially the same structure up to a predefined layer. Thereafter, the memory array is reconfigured by patterning the cells above the predefined layer such that a first plurality of cells function as memory cells, and a second plurality of cells are patterned as a dummy row or column that function as a breakpoint for the memory array.

26 Claims, 3 Drawing Sheets

RECONFIGURABLE MEMORY ARRAYS

FIELD OF THE INVENTION

The present invention relates to reconfigurable memory arrays, and more particularly to a method and system for reconfiguring a memory array through the addition of dummy rows and columns.

BACKGROUND OF THE INVENTION

For system-on-chip applications, embedded memories on the chip are typically implemented by either using hard macros (for large bit requirements) or by using memory compilers to generate a wide range of memories with various word width and depth options. A typical system-on-chip product may contain tens to a few hundreds of memory instances of various sizes, memory types and performance requirements. Each such memory instance comes with its complete set of peripheral circuitry, array termination structures, and may even contain redundant elements to enable repair of defective bits. Some memory arrays can be quite small, therefore the overhead from terminating array structures is higher than in larger memory arrays.

FIG. 1 is a block diagram illustrating a conventional system-on-chip product. The system-on-chip 10 is shown having multiple memory arrays 12 that vary in memory type and size. FIG. 2 is a block diagram illustrating a conventional memory array 12 showing that each memory array 12 includes its own periphery circuitry. The periphery circuitry may include a row decoder 14 along one edge, a sense amplifier 16 along a second edge, and terminating structures 18 along the two remaining edges. The periphery circuitry may also include multiplexing and I/O's not shown.

The terminating structures 18 function to terminate the memory array 12, and typically mimic to some extent the structure of the bit cells comprising the memory array 12 and only qualitatively reproduce cells inside the array. Although any edge bit is surrounded by a similar layout topology as any bit further inside the array 12, terminating structures typically assume simpler forms and are only intended for a smooth transition between highly dense memory areas to low density logic areas. Terminating structures 18 also may contain additional power ring and well connection structures, but do not typically have a mirror line.

FIG. 3 is a block diagram showing a conventional center row decoder memory architecture where two memory arrays 12 share a center row decoder 14. Although in this architecture, only one row decoder is needed for two arrays 12, each memory array 12 still requires a set of terminating edge structures 18, and only two arrays 12 can be combined along the edge occupied by the row decoder. Although the periphery circuitry is not included in the terminating structures, including the periphery circuitry in each of the tens or hundreds of the memory arrays 12 adds significantly to chip overhead. Accordingly, what is needed is a method and system for reconfiguring memory arrays 12 in order to reduce the peripheral overhead and improve memory array effective density. The present invention addresses such a need.

SUMMARY OF THE INVENTION

The present invention provides a method and system for reconfiguring a memory array. Initially, the cells in the memory array are patterned with substantially the same structure up to a predefined layer. Thereafter, the memory array is reconfigured by patterning the cells above the predefined layer such that a first plurality of cells function as memory cells, and a second plurality of cells are patterned as a dummy row or column that function as a breakpoint for the memory array.

According to the first embodiment of the present invention, a base memory array may be reconfigured by fabricating the array with at least one dummy row or column along an edge thereof to provide a link for connecting a second adjacent memory. Once linked, the two arrays share the dummy row or column, thereby reducing periphery overhead.

According to a second embodiment of the present invention, a base memory array may be reconfigured into sub-arrays by placing one or more dummy rows or columns within the boundaries of the array, rather than along the edges, to create and isolate sub-arrays. Both embodiments significantly reduce chip overhead by eliminating redundant structures.

DETAILED DESCRIPTION OF THE INVENTION

The present invention relates to a method for configuring memory arrays. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method for reconfiguring a memory array using dummy row and dummy columns. In the first embodiment, the present invention provides a method for seamlessly combining multiple small memory arrays in a system-on-chip application into a larger memory array for significantly reducing the peripheral overhead and improving memory array effective density. In a second embodiment, the present invention provides a method for dividing a large memory array into smaller sub-arrays.

Both the first and second embodiment of the present invention are achieved by first fabricating the cells comprising the memory array with substantially the same structure up to some predefined layer, preferably metal 1. Thus, many base memory arrays are fabricated as "off-the-shelf" base arrays and are used for subsequent creation of custom memory designs. A base memory array may then be reconfigured by fabricating the base memory array above the predefined layer, such that most of the cells function as memory cells, while a portion of the cells arranged in at least one row or column of the array function as break points for the memory array.

In the first embodiment, a base memory array is reconfigured by fabricating the array with at least one dummy row or column along an edge thereof to provide a link for connecting a second adjacent memory. Once linked, the two arrays share the dummy row or column. In the second embodiment, a base memory array is reconfigured into sub-arrays by placing one or more dummy rows or columns within the boundaries of the array, rather than along the edges, to isolate the sub-arrays.

Figure 4:
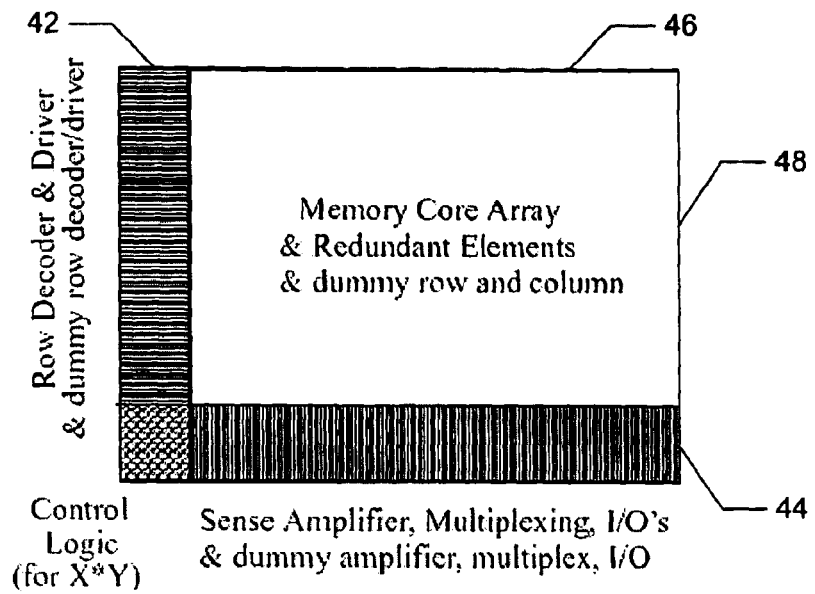
FIG. 4 is a block diagram of the first embodiment of the present invention in which a memory array is provided with one dummy row and dummy column along two edges thereof.

FIG. 4 is a block diagram of the first embodiment of the present invention in which a memory array is provided with one dummy row and dummy column along two edges thereof. Preferably, this embodiment is utilized in hard macro designs where multi-megabit memory arrays are built based on smaller (1 Mb or 2 Mb) sub macro's. Each memory array 40 in a system-on-chip application is designed with one edge having row decoder circuitry 42 and a perpendicular edge having sense amplifier circuitry 44. According to the present invention, the two edges of the array 40 opposite that of the sense amplifier circuitry 44 and the row decoder circuitry 42 are provided with one dummy row 46 and one dummy column 48, respectively.

In the present invention, the memory array is fabricated as an X+1*Y+1 array 40, where only X*Y is used for addressing and the +1 row and column are used for ending the array and for merging with adjacent arrays 40. The conventional "terminating" structures are replaced in the array 40 with one additional row and column, hence, the row decoder 42 and the sense amplifier 44 in the peripheral logic also include a corresponding extra column and row, respectively. Because the cells of the dummy row 46 and dummy column 48 have essentially the same structure as the memory cells, including a mirror line, the dummy row 46 and dummy column 48 do not terminate the memory array, but leave the memory array 40 open so that the memory array 40 can be merged with dummy rows 46 and columns 48 from neighboring memory arrays 40 without impact on functionality on each of the combined arrays. In addition, because the dummy row 46 and dummy column 48 are shared between two adjacent memory arrays 40, the present invention reduces the number of edge structures required for the memory arrays by half.

In state of the art memories, typically the critical layers are limited to layers metal 1 and below. The dummy rows 46 and columns 48 are therefore designed such that only the higher metallization levels, e.g., vial and above are changed, to allow breaking of word lines, and bit lines in the cells comprising the dummy row 46 and dummy column 48. This is needed in order to keep the two combined arrays separate from each other. Furthermore, power or signal lines can be routed as needed along these dummy rows 46 and columns 48. With this dummy row 46 and column 48 method, an array 40 combined of several small arrays will for the most part, look exactly the same as a larger array 40.

In implementation, a memory compiler could be used to define all the memory instances needed for a specific system-on-chip product. Appropriate programming instructs the memory compiler to always place dummy rows and columns 46 and 48 at the outer edge of the memory array 40. Once all the memories needed for are built through the compiler, a special place and route tool that recognizes the dummy row and column segments is utilized to "merge" the individual memory instances together in a larger block.

Figure 5A:
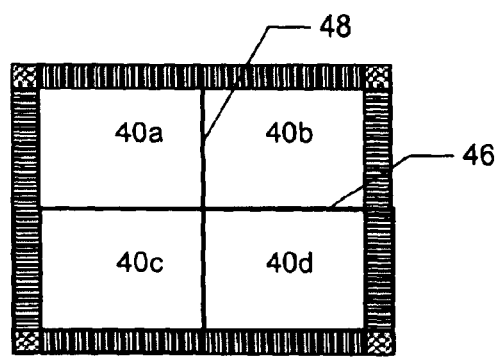
FIG. 5A illustrates four memory arrays combined in a 2×2 pattern.
Figure 5B:
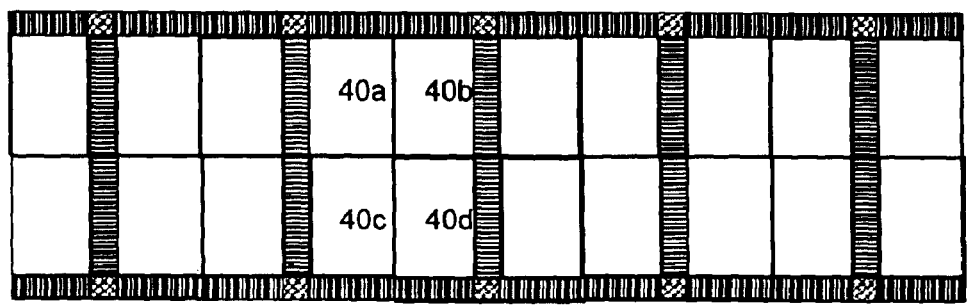
FIG. 5B illustrates a memory configuration in which several larger arrays formed from four smaller arrays are combined in an N×2 pattern using a center row decoder method.

Using the memory architecture scheme shown in FIG. 4, arrays 40 of same size and having the same cell type can be combined, as shown in FIGS. 5A–B. FIG. 5A illustrates four memory arrays 40 combined in a 2×2 pattern, where each memory array is combined with an adjacent memory along edges having a shared dummy row 46 or dummy column 48.

Figure 1:
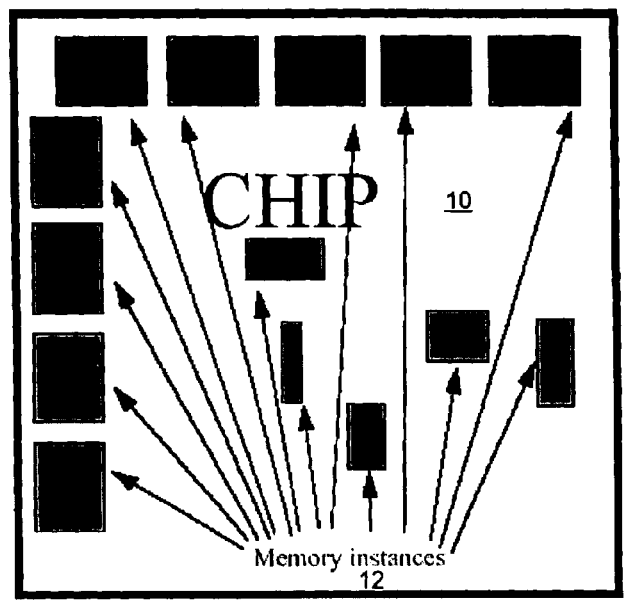
FIG. 1 is a block diagram illustrating a conventional system-on-chip product.
Figure 2:
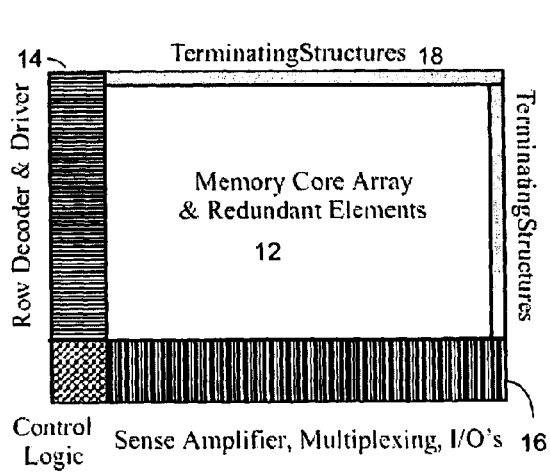
FIG. 2 is a block diagram illustrating a conventional memory array showing that each memory array includes its own periphery circuitry.
Figure 3:
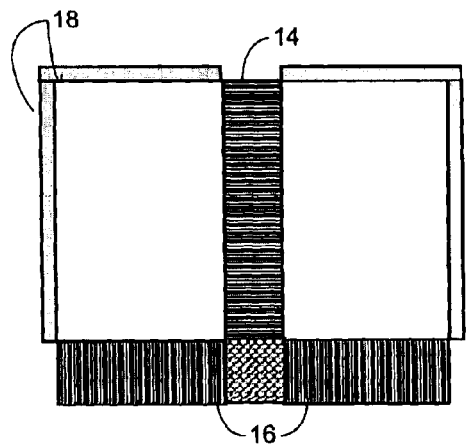
FIG. 3 is a block diagram showing a conventional center row decoder memory architecture where two memory arrays share a center row decoder.

Building arrays 40 using the center row decoder method as shown in FIG. 3 is more attractive as dummy rows 46 and columns 48 can be placed on three sides of the array 40, thus allowing for combining a large number of N arrays along the column direction and up to two arrays along the row direction. FIG. 5B illustrates a memory configuration in which several larger arrays formed from four smaller arrays 40 are combined in an N×2 pattern using a center row decoder method.

Figure 6:
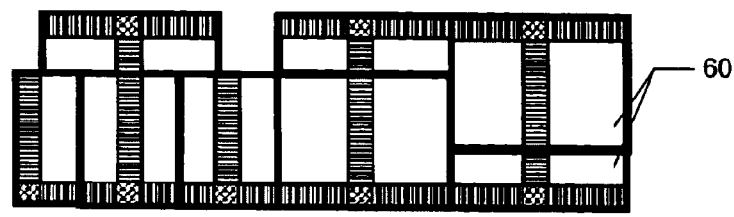
FIG. 6 is a diagram showing arrays of different sizes combined using the center row decoder method.

This aspect of combining arrays 40 of the same type and size can be extended to combining different array sizes and different memory architecture types, as illustrated in FIG. 6. FIG. 6 is a diagram showing arrays 60 of different sizes combined using the center row decoder method. In this architecture, the row decoder is placed in the center of two combined arrays 60 to provide additional flexibility in the number of arrays that can be combined together with minimum overhead.

In the second embodiment of the present invention, the present invention provides a method for dividing a large memory array into smaller sub-arrays. It has been proposed that spacer cells that are evenly spaced across a memory array, e.g., every 8, 16, or 24 bits, may be used to form columns that partition the array into sub-arrays. This strategy, however, has two disadvantages. One disadvantage is that some types of memories may not utilize spacer cells, and spacer cells would then have to be built into the array in order to be used as breakpoints. A second disadvantage is that because spacer cells are located only within specific points of the array, the locations of sub-array boundaries using spaces cells would likewise be position limited.

According to the second embodiment of the present invention, a base memory array can be partitioned into any number of sub-arrays by configuring standard base cells above metal 1 into break cells that form dummy rows or dummy columns within the memory array. As described above, dummy rows and dummy columns may be programmed in any row or column in the array, thereby providing more flexible break points than spacer cells.

Figure 7:
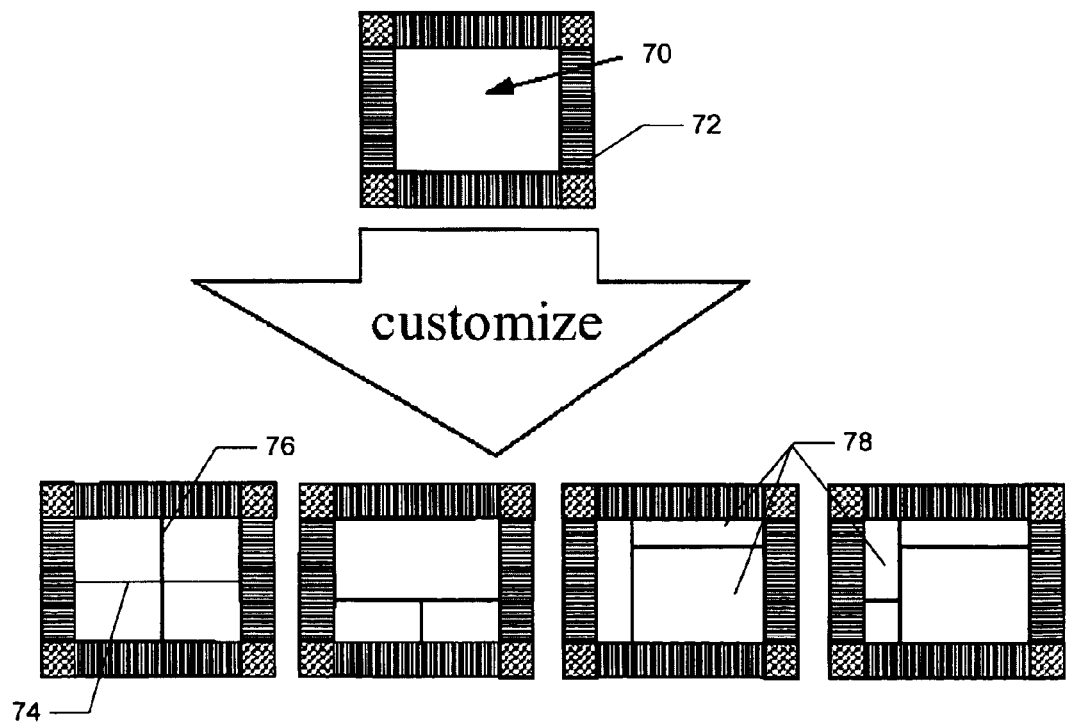
FIG. 7 illustrates a process of configuring a base memory array into sub-arrays using dummy rows and columns.

FIG. 7 illustrates a process of reconfiguring a base memory array 70 into sub-arrays using dummy rows and columns during the design phase. The first step is to provide periphery circuitry 72 on all four sides of the memory array 70 to be partitioned. Thereafter, a custom memory can be designed depending on the customer needs by reconfiguring the base memory array 70 into one or more sub-arrays 78 by using a specially developed slice compiler to identify which rows 74 and which columns 76 of memory cells within the array will be used as break points for defining sub-array boundaries The slice compiler needs to be programmed in such a way to also reconfigure the periphery logic circuits 72 to match the breakpoints. As shown in FIG. 7, periphery logic circuits 72 are placed in all four corners of the initial memory array 70.

During fabrication, all the cells of the base memory array 70 are initially constructed the same up to the predefined layer, such as metal 1, where word lines, bit lines, and power are left unconnected. The memory cells are then customized at higher metallization layers, such that cells designated as normal memory cells are fabricated as such, and cells defined as break points are fabricated with the word lines and/or bit lines left unconnected, thus providing dummy rows 74 and/or columns 76 that isolate sub-arrays 78. The power may be connected or left unconnected in the dummy rows 74 and columns 76 depending on the application. In addition, the periphery logic circuits 72 on each side of the array 70 can be "programmed" at higher metalization levels to control a particular section of the array 70. However, it is also possible that one of the periphery logic circuit 72 can be programmed to control all different subdivisions of the array 70.

A method and system for configuring a memory array using dummy rows and columns have been disclosed wherein in one embodiment, smaller memory arrays can be combined into one larger array in system-on-chip applications, and in a second embodiment, a large memory array can be partitioned into smaller sub-arrays.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for reconfiguring a memory array, comprising;
   (a) patterning cells in the memory array with substantially the same structure up to a predefined layer; and
   (b) patterning the cells above the predefined layer, such that a first plurality of cells function as memory cells, and a second plurality of cells aligned in at least one row or column function as a break point for the array, thereby forming a dummy row or column.

2. The method of claim 1 wherein step (b) further includes the step of: fabricating the memory array with at least one dummy row or column along an edge thereof to provide a link for connecting a second adjacent memory, wherein once linked, the two memory arrays share the dummy row or column that links the two memory arrays.

3. The method of claim 2 wherein step (b) further includes the step of: providing one edge of the memory array with row decoder circuitry and providing a perpendicular edge with sense amplifier circuitry.

4. The method of claim 3 wherein step (b) further includes the step of: patterning a dummy row and dummy column along at two edges of the memory array opposite of the sense amplifier circuitry and the row decoder circuitry, respectively.

5. The method of claim 4 further including the steps of:
   (i) using the memory array in a system-chip application that includes multiple configurable memory arrays, each designed with the dummy row and dummy column along two perpendicular edges thereof; and
   (ii) combining the multiple memory arrays by overlapping adjacent dummy rows or columns of neighboring memory arrays, such that only a single dummy row or dummy column, respectively, is required between a pair of neighboring memory arrays.

6. The method of claim 5 wherein step (b) further includes the steps of: fabricating the memory array as an X+1*Y+1 array, where only X*Y is used for addressing.

7. The method of claim 6 wherein step (b) further includes the step of: combining two memory arrays of a same type and size.

8. The method of claim 7 wherein step (b) further includes the step of: combining four memory arrays in a 2×2 pattern.

9. The method of claim 7 wherein step (b) further includes the step of: combining a plurality of N memory arrays in an N×2 pattern, where a center decoder is shared by each pair of memory arrays.

10. The method of claim 6 wherein step (b) further includes the step of: combining two memory arrays of different sizes.

11. The method of claim 1 wherein step (b) further includes the step of: subdividing the memory array into at least two sub-arrays by,
   (i) providing periphery circuitry on all four sides of the memory array; and
   (ii) patterning the dummy row or column of cells along at least one row or column within the memory array, in which each cell in the dummy row or column includes a severed word line or bit line to provide isolation between the sub-arrays.

12. The method of claim 11 wherein step (a) further includes the step of: initially fabricating all cells of the base memory array with a same structure up to a predefined layer, wherein word lines, bit lines, and power are left unconnected.

13. The method of claim 12 wherein step (b) further includes the step of: customizing the memory array at higher layers, such that cells designated as normal memory cells are fabricated as such, and cells defined as break points are fabricated with the word lines and/or bit lines left unconnected, thus providing isolation between the sub-arrays.

14. A reconfigurable memory array, comprising;
   a plurality of cells patterned in the memory array with substantially a same structure up to a predefined layer;
   a first plurality of cells patterned above the predefined layer to function as memory cells; and
   a second plurality of cells aligned in at least one row or column patterned above the predefined layer to function as a break point for the array, thereby forming a dummy row or column.

15. The memory array of claim 14 wherein the memory array is fabricated with at least one dummy row or column along an edge thereof to provide a link for connecting a second adjacent memory, wherein once linked, the two memory arrays share the dummy row or column that links the two memory arrays.

16. The memory array of claim 15 wherein one edge of the memory array includes row decoder circuitry and a perpendicular edge includes sense amplifier circuitry.

17. The memory array of claim 16 wherein two edges of the memory array opposite of the sense amplifier circuitry and the row decoder circuitry include a dummy row and dummy column, respectively.

18. The memory array of claim 17 wherein the memory array is used in a system-on-chip application that includes multiple configurable memory arrays, each designed with the dummy row and dummy column along two perpendicular edges thereof; and wherein the multiple memory arrays are combined by overlapping adjacent dummy rows or columns of neighboring memory arrays, such that only a single dummy row or dummy column, respectively, is required between a pair of neighboring memory arrays.

19. The memory array of claim 18 wherein the memory array is fabricated as an X+1*Y+1 array, where only X*Y is used for addressing.

20. The memory array of claim 19 wherein two memory arrays of a same type and size are combined.

21. The memory array of claim 20 wherein four memory arrays are combined in a 2×2 pattern.

22. The memory array of claim 20 wherein a plurality of N memory arrays are combined in an N×2 pattern, where a center decoder is shared by each pair of memory arrays.

23. The memory array of claim 19 wherein two memory arrays of different sizes are combined.

24. The memory array of claim 23 wherein the memory array includes periphery circuitry on all four sides and is subdivided into at least two sub-arrays by a dummy row or column of cells along at least one row or column within the memory array, in which each cell in the dummy row or column include a severed word line or bit line to provide isolation between the two sub-arrays.

25. The memory array of claim 24 wherein the cells of the base memory array are initially fabricated with a same structure up to a predefined layer, wherein word lines, bit lines, and power are left unconnected.

26. The memory array of claim 25 wherein the memory array is customized at higher layers, such that cells designated as normal memory cells are fabricated as such, and cells defined as break cells are fabricated with the word lines and/or bit lines left unconnected, thus providing isolation between the sub-arrays.

* * * * *